US007782646B2

(12) United States Patent
Lam et al.

(10) Patent No.: US 7,782,646 B2
(45) Date of Patent: Aug. 24, 2010

(54) HIGH DENSITY CONTENT ADDRESSABLE MEMORY USING PHASE CHANGE DEVICES

(75) Inventors: Chung Hon Lam, Peekskill, NY (US); Bipin Rajendran, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 113 days.

(21) Appl. No.: 12/165,530

(22) Filed: Jun. 30, 2008

(65) Prior Publication Data

US 2009/0323384 A1 Dec. 31, 2009

(51) Int. Cl.
G11C 15/00 (2006.01)
(52) U.S. Cl. .................. 365/49.17; 365/148; 365/49.1; 365/163
(58) Field of Classification Search ............... 365/49.17, 365/148, 49.1, 163
See application file for complete search history.

(56) References Cited

U.S. PATENT DOCUMENTS

| 7,050,316 | B1 | 5/2006 | Lin et al. ........................ 365/49 |
| 7,221,600 | B2 * | 5/2007 | Hara et al. .............. 365/189.08 |
| 7,227,765 | B2 | 6/2007 | De Sandre et al. ............. 365/49 |
| 2005/0174837 | A1 | 8/2005 | Hanyu et al. |
| 2007/0002608 | A1 * | 1/2007 | Hsu et al. .................... 365/163 |
| 2007/0097740 | A1 | 5/2007 | Derhacobian et al. ........ 365/163 |
| 2008/0068872 | A1 | 3/2008 | Lee et al. .................. 365/49.17 |

FOREIGN PATENT DOCUMENTS

| EP | 0905707 | 3/1999 |
| EP | 1865512 | 12/2007 |
| JP | 56098791 | 8/1981 |
| JP | 10242432 | 9/1998 |
| WO | WO 2007/005067 | 1/2007 |
| WO | WO 2007/005067 A1 | 1/2007 |

OTHER PUBLICATIONS

Kramer A.H., "Array-based analog computation: principles, advantages and limitations", Microelectronics for Neural Networks, 1996, Proceedings of Fifth International Conference on Lausanne, Switzerland Feb. 12-14, 1996, Los Alamitos, CA, USA, IEEE Comput. Soc., US, pp. 68-79.
Mingjie Lin et al., "A low-power monolithically stacked 3D-TCAM", Circuits and Systems, 2008, ISCAS 2008, IEEE International Symposium on , IEEE, Piscataway, NJ, USA, pp. 3318-3321.
Extended European Search Report dated Mar. 27, 2009.
Japan Office Action dated Oct. 30, 2009.

* cited by examiner

Primary Examiner—Huan Hoang
(74) Attorney, Agent, or Firm—Ido Tuchman; Shimokaji & Associates, P.C.

(57) ABSTRACT

A content addressable memory array storing stored words in memory elements. Each memory element stores one of at least two complementary binary bits as one of at least two complementary resistances. Each memory element is electrically coupled to an access device. An aspect of the content addressable memory array is the use of a biasing circuit to bias the access devices during a search operation. During the search operation, a search word containing a bit string is received. Each access device is biased to a complementary resistance value of a corresponding search bit in the search word. A match between the search word and stored word is indicated if the bits stored in the memory elements are complementary to the bits represented by the resistances in the access devices.

22 Claims, 5 Drawing Sheets

| Access Transistor Resistance | Memory Element Resistance | Match-Line Value |
|---|---|---|
| 0 | 1 | Match |
| 1 | 0 | Match |
| 1 | 1 | No match |
| 0 | 0 | No match |

Fig. 2

HIGH DENSITY CONTENT ADDRESSABLE MEMORY USING PHASE CHANGE DEVICES

BACKGROUND OF THE INVENTION

1. Field of the Invention

The present invention relates to content addressable memory, and more specifically a high density content addressable memory cell utilizing phase change material and an access device.

2. Description of Background

Content addressable memory (CAM) is a type of computer memory utilized in high speed searching applications. Most CAM devices utilize static random access memory (SRAM) as data storage devices (utilizing transistors to store memory), and additional transistors and complementary transistors for match operations. Typically in these CAM devices search-line access elements and word-line access elements are necessary to operate and program individual memory cells in the memory arrays. The search-line access elements and word-line access elements are often comprised of power intensive large drive field effect transistors (FET).

Phase change material can also be utilized to store information in CAM devices. Phase change materials can be manipulated into different phases or states, with each phase representing a different data value. Generally, each phase exhibits different electrical properties. The amorphous and crystalline phases are typically two phases used for binary data storage (1's and 0's) since they have detectable differences in electrical resistance. Specifically, the amorphous phase has a higher resistance than the crystalline phase.

Chalcogenides are a group of materials commonly utilized as phase change material. They typically contain a chalcogen (Periodic Table Group 16/VIA) and a more electropositive element. Selenium (Se) and tellurium (Te) are the two most common semiconductors in the group used to produce a chalcogenide when creating a phase change memory cell. Examples of this type of material are $Ge_2Sb_2Te_5$ (GST), SbTe, and $In_2Se_3$. However, some phase change materials do not utilize chalcogen, such as GeSb. Thus, a variety of materials can be used in a phase change material cell as long as they can retain separate amorphous and crystalline states.

Two problems in phase change CAM devices and standard CAM devices are the large size of individual memory cells in the memory devices (requiring complementary access transistors and complementary memory elements) and the large power required to perform search operations in the memory devices (requiring word-line charging using large, power intensive drive FETs). Thus, it is desirable to devise a method to reduce the size of the individual memory cells and to eliminate word-line charging.

SUMMARY OF THE INVENTION

One aspect of the invention is a method for operating a content addressable memory array. The content addressable memory array includes a plurality of memory cells arranged to store collection of bits of information as stored words. Each memory cell includes a memory element electrically coupled to an access transistor in series circuit. The memory element is configured to store binary data as one of at least two complementary resistances.

The method is comprised of receiving a search word and determining the location within the content addressable memory array wherein the stored word data matches the search word data, in bit-by-bit sequential order. The method also includes biasing the access transistor of each memory cell of each stored word. The effective resistance of the access transistor is the complementary resistance of the corresponding bit of the search word. The method is also comprised of measuring a collective current passing through the memory cells for each stored word. Additionally, the method includes indicating a search match for each stored word if the collective current is within a predetermined value range.

Another aspect of the invention is a content addressable memory array. The content addressable memory array includes a plurality of memory cells combined to store stored words. Each memory cell includes a memory element electrically coupled to an access transistor in series circuit. The memory element is configured to store binary data as one of at least two complementary resistances. The content addressable memory array includes a receiving unit configured to receive a search word and determining the location within the content addressable memory array wherein the stored word data matches the search word data, in bit-by-bit sequential order. The content addressable memory array also includes a biasing unit configured to bias the access transistor of each memory cell such that the effective resistance of the access transistor is the complementary resistance of the corresponding bit of the search word. Additionally, the content addressable memory array includes a matching unit. The matching unit is configured to measure a collective current passing through the memory cells for each stored word. The matching unit is also configured to indicate a search match for each stored word if the collective current is within a predetermined value range.

Yet another aspect of the invention is a memory device. The memory device comprises a memory element settable to a stored resistance. The stored resistance is one of at least two complementary resistances associated with one of at least two complementary binary values. The memory device also includes an access transistor that includes a common terminal controlling a current flow between a first terminal and a second terminal. The first terminal is electrically coupled to the memory element. The memory device also includes a biasing circuit. The biasing circuit is electrically coupled to the common terminal and is configured to bias the access transistor to an effective resistance that is complementary to the resistance associated with a search bit.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 2 illustrates a truth table for determining match-line results.

DETAILED DESCRIPTION OF THE INVENTION

The present invention is described with reference to embodiments of the invention. Throughout the description of the invention reference is made to FIGS. 1-5.

As described in detail below, an aspect of the current invention is a content addressable memory array comprised of a plurality of memory cells. Each individual memory cell includes a memory element electrically coupled to an access transistor in series circuit. A plurality of access transistors are electrically coupled to a single match-line. The access transistors control the current flow between a paired bit-line and a match-line. Each bit-line and each match-line is electrically coupled to a plurality of memory cells. The memory cell design advantageously eliminates the need to include complementary access transistor and memory element structures in each memory cell. As a result, the real estate occupied by each memory cell is reduced and the memory cell's power consumption is decreased as compared to conventional CAM memory cells.

In an embodiment of the invention, the memory element of the memory cell is comprised of a phase change material capable of storing one of at least two complementary resistances. An example of such phase change material is Germanium-Antimony-Tellurium (GST). In one example of a phase change memory element, the memory element may be programmed to one of two states: a crystalline state or an amorphous state. The crystalline state may represent a stored "0" value and the amorphous state may represent a stored "1" value. In the crystalline state, the memory element exhibits a relatively low resistance. On the other hand, in the amorphous state, the memory element has a relatively high resistance. Again, those skilled in the art will recognize that a variety of resistors may be utilized for the memory element and the example of phase change material is merely illustrative.

In phase change memory, altering a memory element's state requires heating the material to a melting point and then cooling the material to one of the possible states. A current passed through the memory element creates ohmic heating and causing the phase change material to melt. Melting and gradually cooling down the phase change material in the memory element allows time for the phase change material to form the crystalline state. Melting and abruptly cooling the phase change material in the memory element quenches the phase change material into the amorphous state.

Figure 1:
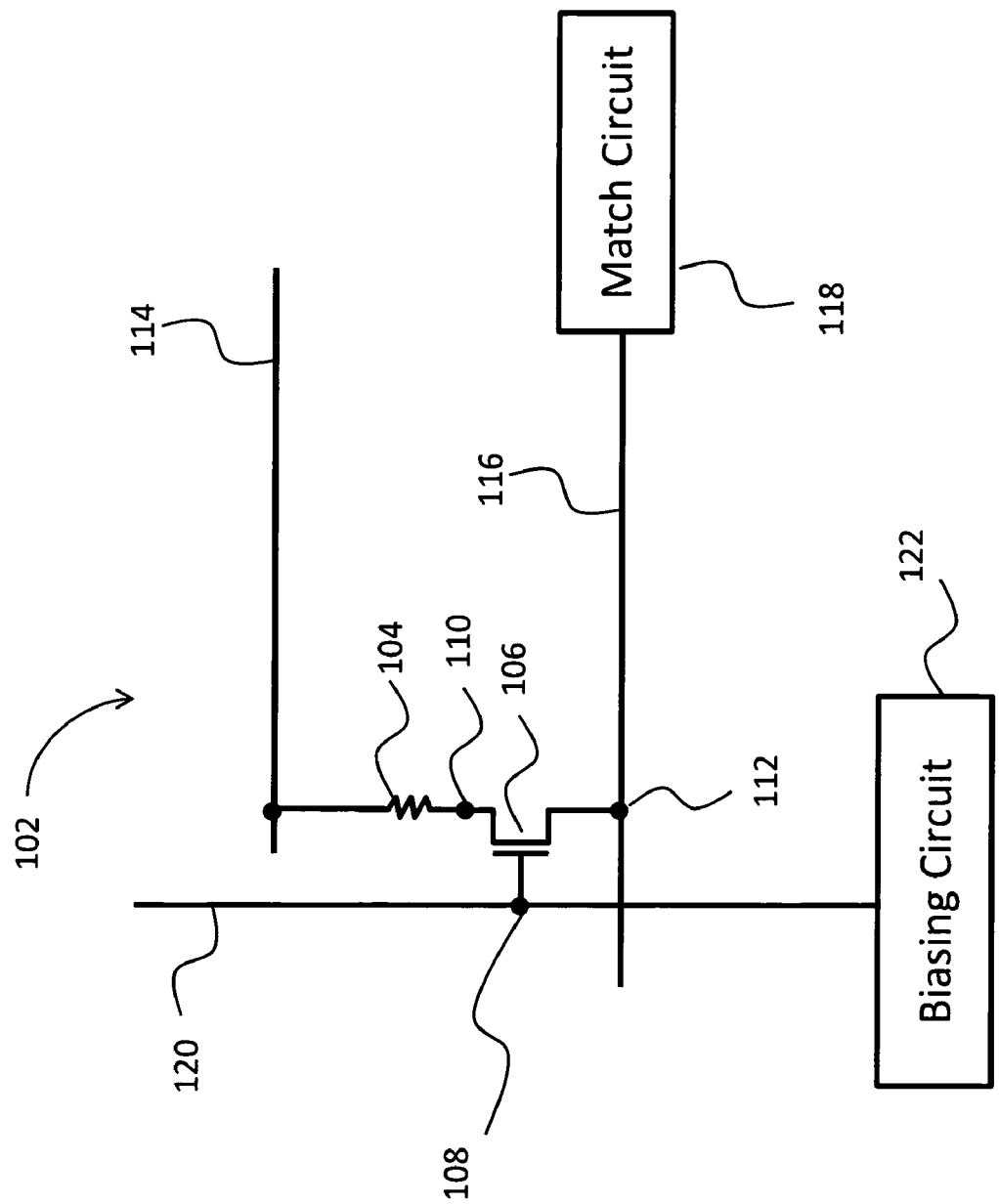
FIG. 1 illustrates one embodiment of a memory device contemplated by the present invention.

In FIG. 1, an embodiment a memory device 102 in accordance with the present invention is shown. The memory device 102 includes a memory element 104 and an access device 106. The memory element 104, is discussed above, is settable to a stored resistance. More specifically, the stored resistance can be one of at least two complementary resistances associated with one of at least two complementary binary values. For example, in one-bit memory storage, the memory element 104 may store either a "0" or a "1". The "0" and "1" are stored as complementary resistances, such as 5 k ohms and 500 k ohms. In two-bit memory storage, the memory element 104 may store "00", "01", "10", or "11". In this example, "00" and "11" are stored as complementary resistances and "01" and "10" are stored as complementary resistances. In a particular embodiment of the invention, the memory element 104 is a phase change device. In another embodiment of the invention, the memory element 104 is comprised of a floating gate transistor, a resistive memory element, Magnetoresistive Random Access Memory (MRAM), or charge trapping device.

The access device includes a common terminal 108 controlling a current flow between a first terminal 110 and a second terminal 112. The first terminal 110 of the access device 106 is electrically coupled to the memory element 104. In a particular embodiment of the invention, the access device 106 is a metal-oxide semiconductor field-effect transistor (MOSFET). It is contemplated that other access devices may be substituted for the access device 106, such as a bipolar junction transistor (BJT), without departing from the spirit and scope of the invention.

As shown, the memory element 104 is also electrically coupled to a bit-line 114. Those skilled in the art will appreciate that the bit-line 114 can be used to both program the memory element 104 to a desired state and to read the state of the memory element 104. For example, during programming, a high current is passed through the bit-line 114 and into the memory element 104, thereby causing the phase change material to melt from ohmic heating. During memory search or read operation, a low current is passed through the bit-line 114 and into the memory element 104 which is insufficient to melt the phase change material, but large enough to detect the voltage drop across the memory element 104.

The second terminal 112 of the access device 106 is electrically coupled to a match-line 116. During programming, the match-line 116 acts to sink (or source) the relatively high current passing through the memory element 104, thereby causing the phase change material to melt. During a memory search operation, the match-line 116 passes the current through the memory element 104 to a match circuit 118. As will be discussed in more detail below, the match circuit 118 is configured to indicate a search match only if the effective resistance of the access device 106 and the stored resistance of the memory element 104 are complementary to each other.

The common terminal 108 of the access device 106 is electrically coupled to a search-line 120. During memory programming, the search-line 120 is used to turn on the access transistor such that a high amount of current is allowed to flow through the memory element 104 and change the state of the memory element 104. During memory search, the search-line 120 is controlled by a biasing circuit 122 electrically coupled to the search-line 120. The biasing circuit is configured to bias the access device 106 to an effective resistance that is complementary to the resistance associated with a search bit.

During a search operation, a search word is received from an external source, such as a central processing unit (CPU) or an external memory controller. The search word is a bit string containing binary values to be searched in the memory array. Each search bit in the search word corresponds to a stored bit in the memory device 102 in bit-by-bit sequential order. The biasing circuit 122 biases the access device 106 to an effective resistance that is complementary to the resistance associated with the search bit. For example, if the search bit is a "1" (RESET resistance or amorphous state in phase change memory) then the effective resistance of the access device 106 is set to "0". If the search bit is a "0" (SET resistance or crystalline state in phase change memory) then the effective resistance of the access device 106 is set to "1". The match circuit 118 then measures a search current applied from the bit-line 114 to the match-line 116. The search current passes through the memory element 104 and the access device 106, thus the collective resistance of the memory element 104 and the access device 106 can be measured. Those skilled in the art will recognize that a variety of techniques and circuits may be utilized for resistance measurement, such as but not limited to, current measurement circuits and current control oscillators.

Turning to FIG. 2, a table of match resistances 202 for one embodiment of the invention is shown. The table illustrates access transistor resistance 204, memory element resistance 206, and match-line values 208. Note that the resistances "0" and "1" are stored as arbitrary resistance values in the memory elements. For example, 5 k ohms could represent "0" and 500 k ohms could represent "1".

As illustrated, if the access transistor resistance 204 is the complementary value of the memory element resistance 206, then the match-line value 208 is considered a match. If the access transistor resistance 204 and the memory element resistance 206 are both equal to "1" or "0", then the match-line value 208 is not considered a match.

During a search operation, the match circuit 118 (see FIG. 1) determines a "match" or "no match" by measuring a search current flowing through the memory element and access transistor. If the search current is within a predetermined value range, a "match" result is returned by the match circuit; otherwise, a "no match" result is returned.

Consider, for example, if the access transistor resistance 204 and the memory element resistance 206 are both equal to "0". In this case the current detected by the match circuit will be too high and will fall outside a match value range. If the memory element resistance 206 and the access transistor resistance 204 are complementary, the match-line value 208 will be an intermediate value falling inside the match value range. The match circuit indicates no match if the access transistor resistance 204 and the memory element resistance 206 are both equal to "1". In this case the current detected by the match circuit will be too low and will also fall outside a match value range. Using the example above, there are only three theoretical measured resistances possible: 10 k ohms, 505 k ohms, and 1000 k ohms. A range of match values centered at 505 k ohms can be created such that a match is indicated only if the match-line values 208 are in this range.

In an alternate embodiment of the invention, a single memory element may store multiple bits. In two-bit storage, a single memory element may store "00", "01", "10", or "11". Again, a match is indicated when the search bits and the stored bits are complementary. For example, if the search bit is "01" then the stored bit in the memory element must be "10" for a match.

Turning back to FIG. 1, programming operations of the memory device 102 involve receiving a store word from the CPU. The store word contains a bit string to be stored in the memory array. Each store bit of the store word is stored in a single memory element 104. The biasing circuit 122 biases the access device 106 by applying a pre-determined signal sufficient to store the store bit in the memory element. For example in phase change memory, to store a "1" (RESET or amorphous state) the common terminal 108 of the access device 106 is pulsed with a relatively high current signal through the memory element 104. A quick power cut-off resulting in an abrupt trailing edge causes the phase change material in the memory element 104 to quench and set in the amorphous state. To store a "0" (SET or crystalline state) the current signal at the common terminal 108 of the access device 106 is slowly decreased in amplitude. This results in a gradual trailing edge and the phase change material in the memory element 104 is allowed to slowly cool and set in the crystalline state. Again, it is noted that a single memory element 104 may store multiple bits as those skilled in the art will appreciate.

Figure 3:
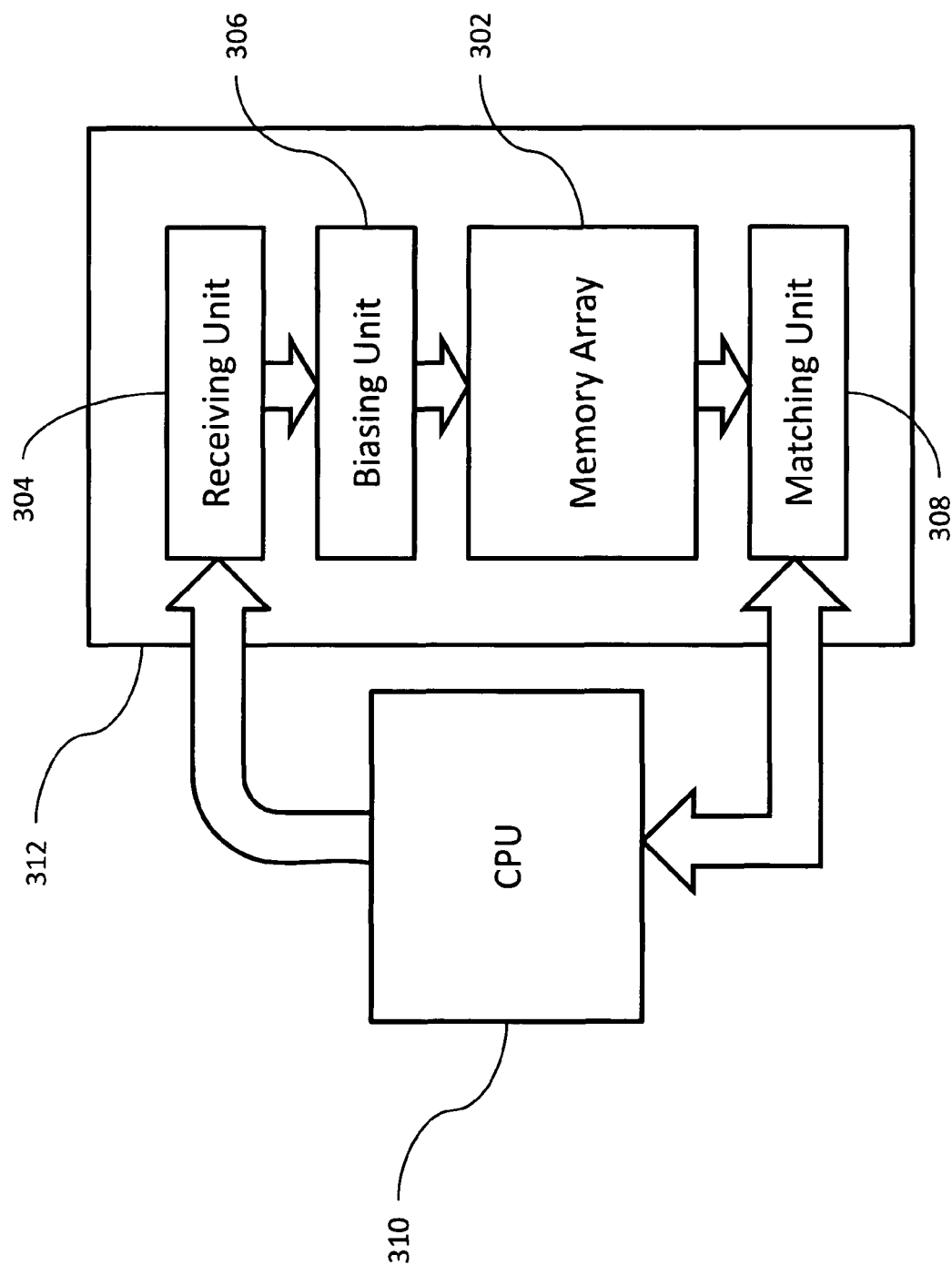
FIG. 3 illustrates a memory system contemplated by the present invention.

FIG. 3 shows an embodiment of a memory system diagram contemplated by the invention. The system includes the memory array 302, a receiving unit 304, a biasing unit 306, a matching unit 308, and a central processing unit (CPU) 310. In one particular embodiment of the invention, the memory device 312 includes the receiving unit 304, the biasing unit 306, the content addressable memory array 302, and the matching unit 308. In other embodiments of the invention, the receiving unit 304, the biasing unit 306, and the matching unit 308 can be separately packaged. In yet other embodiments, units of the memory system can be embodied in computer readable medium as a set of computer executable instructions.

The memory array 302 includes a plurality of memory cells combined to store stored words. As discussed above, each memory cell includes a memory element electrically coupled to an access transistor in series circuit. The memory elements are configured to store binary data as one of at least two complementary resistances.

The receiving unit 304 receives information from the CPU 310. As part of its functionality, the receiving unit 304 determines whether an operation requested by the CPU 310 is a programming operation or a search operation. In particular, the receiving unit 304 is configured to receive a search word for search in the stored words of the memory array 302, wherein bit locations of the search word correspond to bit locations of the stored words in bit-by-bit sequential order. The receiving unit 304 relays the information to the biasing unit 306.

The biasing unit 306 biases the access transistors in the memory array 302 for the programming operation or the search operation (as described above). During a search operation, the biasing unit is configured to bias the access transistor of each memory cell such that the effective resistance of the access transistor is the complementary resistance of the corresponding bit of the search word. Also during the search operation, the matching unit 308 is configured to measure a collective current passing through the memory cells for each stored word and indicate a search match for each stored word if the collective current is within a predetermined value range. The matching unit 308 indicates a search match and a match location for the CPU 310.

Figure 4:
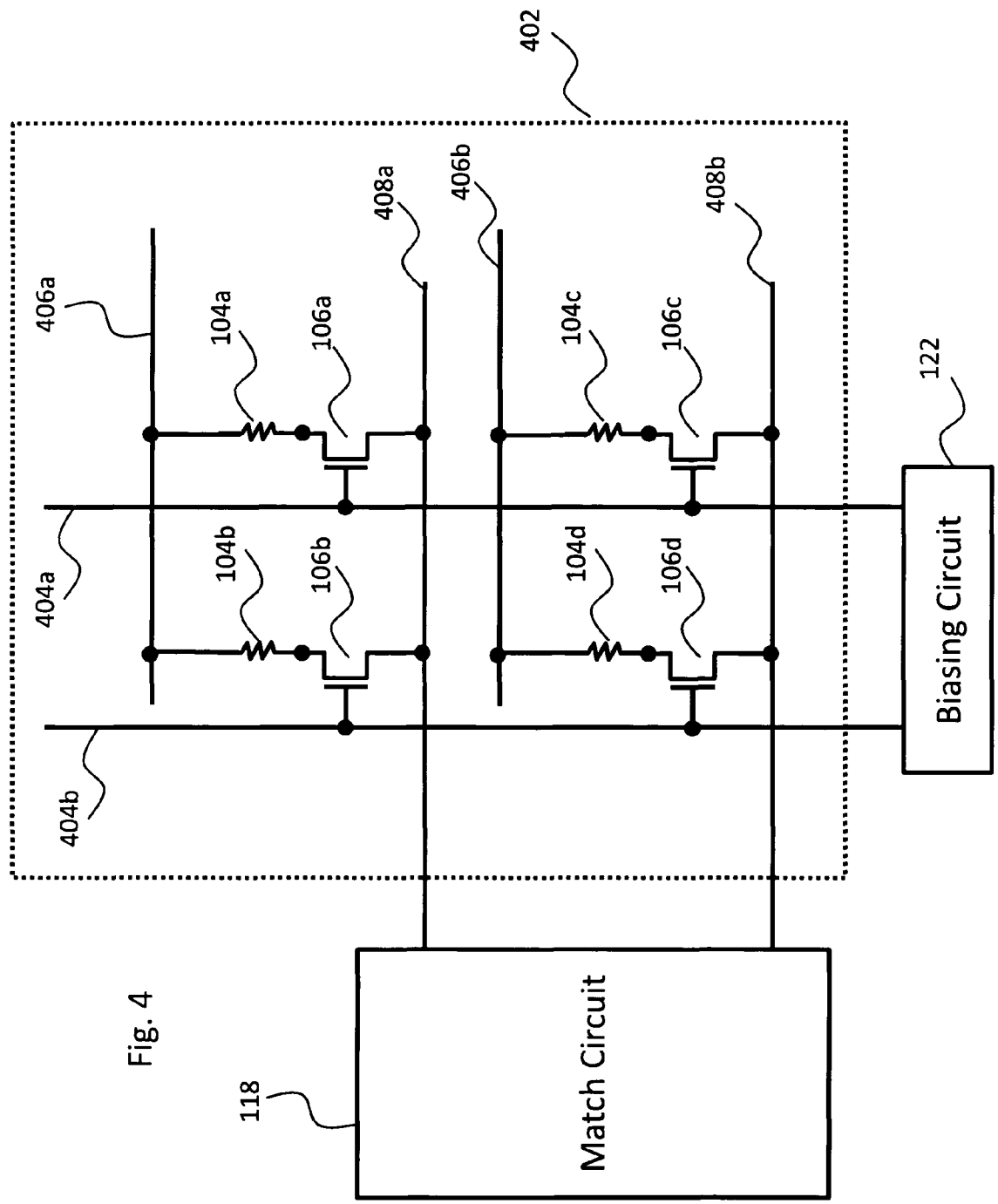
FIG. 4 illustrates a content addressable memory array contemplated by the present invention.

Now turning to FIG. 4, an embodiment of the content addressable memory array 402 is illustrated. By way of example, we illustrate a two-by-two content addressable memory array showing four memory cells. The content addressable memory array 402 is comprised of a plurality of memory elements 104 electrically coupled to access transistors 106. The memory elements 104 are electrically coupled to bit-lines 406 such that a plurality of memory elements 104 is electrically coupled to a single bit-line 406. The access transistors 106 are electrically coupled to search-lines 404 and match-lines 408. A plurality of access transistors 106 is electrically coupled to a single search-line 404 and a single match-line 408.

In this particular embodiment of the invention, programming operations and search operations involve the activating of bit-lines 406a and search-lines 404a. During the programming operation of the content addressable memory array 402 two two-bit long store words (words to be stored) are received. Individual memory elements 104a, 104b are assigned to store the two bits of the first two-bit long store word, and memory elements 104c and 104d are assigned to store the two bits of the second two-bit long store word. To store a particular store bit in a target memory element 104a, the bit-line 406a electrically coupled to the target memory element 104a is set to a supply voltage. All the match-lines 408a and 408b are set to ground voltage. If the store bit equals "1" (RESET or amorphous state) then a signal is applied at the search-line 404a electrically coupled to the target access transistor 106a associated with the target memory element 104a that quickly melts and cools the phase change material in the memory element 104a. If the store bit equals "0" (SET or crystalline state) then the search-line 404a is controlled to gradually cool the melted phase change element. The other search-line 404b is set to ground voltage. This process is performed until all store bits in the store word have been programmed in the content addressable memory array 402.

During the search operation of the memory array 404, the search word is received, wherein bit locations of the search word correspond to bit locations of the stored words in bit-by-bit sequential order. All bit-lines 406 are set to the supply voltage and all match-lines 408 are connected to the match circuit 118. The biasing circuit 122 sets the search-lines 404 to either a relatively high voltage or a relatively low voltage such that the effective resistances of the access transistors 106 are complementary to the search bits in the search word.

For example, let us assume memory elements 106a and 106b form the first and second bits of a stored word, respectively. Let us also assume 5 k ohms represents "0" and 500 k ohms represents "1". If the first bit in the search word is a "1", the search-line 404a electrically coupled to the target access transistor 106a is set to a relatively high voltage such that the effective resistance of the target access transistor 106a is controlled to equal "0", or 5 k ohms. If the first bit in the search word is a "0", the search-line 404a electrically coupled to the target access transistor 106a is set to a relatively low voltage. This brings the effective resistance of the corresponding access transistor 106a equal to "1", or 500 k ohms. A bit match occurs if the resistance of the electrically coupled memory element 104a is complementary to the effective resistance of the access transistor 106a.

When searching for search words, a whole bit string is searched and, as illustrated, a plurality of memory elements 104a and 104b and access transistors 106a and 106b are electrically coupled (in parallel) to a single match-line 408a and bit-line 406a. A match only occurs if every bit in the stored word matches every bit in the search word. The match circuit indicates a match if the net resistance of the match-line equals $R_0(k+1)/n$, where $R_0$ is the SET resistance ("0" or crystalline state resistance), k is the SET-RESET ratio (the resistance ratio between the SET and RESET state), and n is the number of bits in the search word. For example, assume the SET resistance is 5 k ohms and the RESET resistance is 500 k ohms, and the number of bits per word is two. A match would occur only if the net resistance across bit-line 406a and match-line 408a equals 252.5 k ohms. That is, the total resistance of memory element 104a in series with access transistor 106a, in parallel with memory element 104b in series with access transistor 106b. However, in practice, a precise number such as 252.5 k ohms would be very difficult to replicate every time a search operation is performed. Thus, a value range centered on this value is used in place of an exact number.

Figure 5:
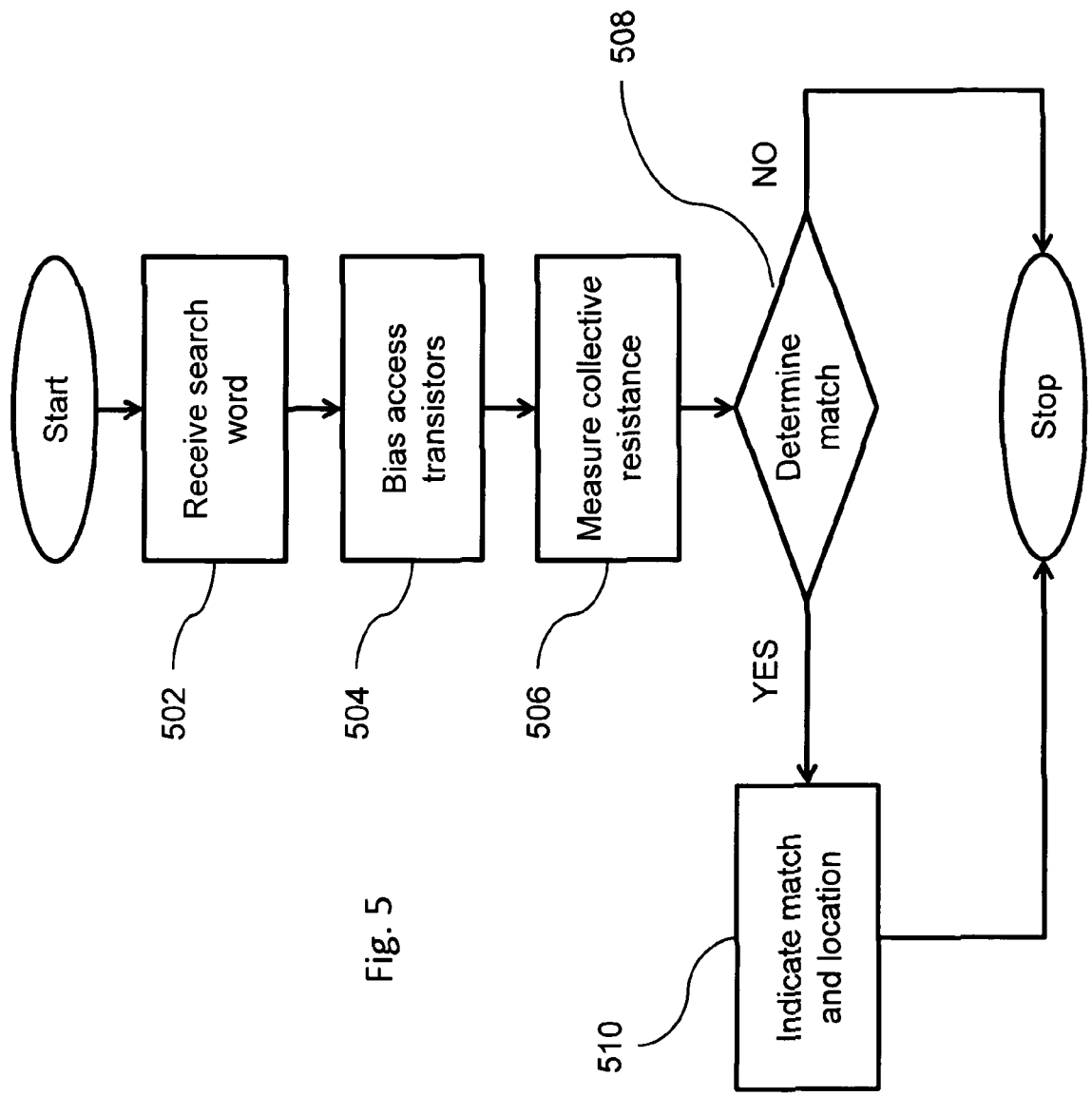
FIG. 5 illustrates a process flow for operating a memory array contemplated by the present invention.

FIG. 5 illustrates one embodiment of the invention for the search operation of the memory array. The search operation of the memory array allows the word searches to be performed on the memory array. The operations depicted in FIG. 5 can be implemented in software, firmware, hardware or some combination thereof. Program code logic may be stored in a storage medium, loaded into and/or executed by a computer, wherein, when the program code logic is loaded into and executed by a computer, the computer becomes an apparatus for practicing the invention. Examples of storage medium include solid-state memory (RAM or ROM), floppy diskettes, CD-ROMs, hard drives, universal serial bus (USB) flash drives, or any other computer-readable storage medium.

Process flow of the search operation begins at receiving operation 502. During this operation, the search word is received from an external source such as a central processing unit (CPU) or an external memory controller. The search word includes an n-bit bit string. The n-bit bit string contains n search bits. After the receiving operation 502 is completed, control passes to biasing operation 504.

At biasing operation 504, the access transistors of a corresponding stored word are set to resistances complementary to bit values of the n search bits. It is contemplated that in an equivalent embodiment of the invention the access transistors of the corresponding stored word are set to resistances non-complementary to bit values and the stored words are stored as complementary values. After the biasing operation 504 is completed, control passes to measuring operation 506.

At measuring operation 506, current flows from the bit-line to the match-line through the memory elements and access transistors in the stored word. The collective current passing through the access transistors and memory elements is measured on a single match-line. After measuring operation 506 is completed, control passes to determining operation 508.

At determining operation 508, the net current of the match-line is compared to a value range. If the net current is within the value range then there is a match and control passes to indicating operation 510. If the net current is not within the value range then the search operation ends.

At indicating operation 510, a match between the search word and the stored word is indicated and the stored word location is relayed back to the external source. After the stored word location is indicated, the process flow ends.

Having described preferred embodiments for the content addressable memory device (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method comprising:
   operating a content addressable memory array, the content addressable memory array including a plurality of memory cells arranged to store a collection of bits of information as stored words, each memory cell including a memory element electrically coupled to an access transistor in series circuit, the memory element configured to store binary data as one of at least two complementary resistances;
   using the access transistors to control current flow between lines of bits and a match line;
   indicating a search match for a stored word if a collective current passing through the memory cells for each stored word is within a predetermined value range;
   receiving a search word for search through the content addressable memory array;
   biasing the access transistor of each memory cell of each stored word such that the effective resistance of the access transistor is the complementary resistance of a corresponding bit of the search word;
   measuring total resistance of the memory cells for the stored words; and
   indicating a search match for each stored word if the total resistance is within a predetermined value range.

2. The method of claim 1, wherein the memory elements include at least one of a phase change element, a resistive memory element, a floating gate FET, a Magnetoresistive Random Access Memory (MRAM), and a charge trapping device.

3. The method of claim 1, further comprising indicating a memory location of at least one stored word if the total resistance is within the predetermined value range.

4. The method of claim 1, wherein the access transistors are metal-oxide semiconductor field-effect transistors (MOSFET).

5. The method of claim 1, wherein the access transistors are electrically coupled to search-lines such that a plurality of the access transistors are electrically coupled to a single search-line conductor.

6. The method of claim 5, further comprising:
receiving a store word for storage in the content addressable memory array, each bit in the store word stored to an individual memory cell; and
storing the store word in the content addressable memory array by applying a pre-determined signal in the search-lines such that current pulses, that pass through the access transistors of the desired memory cells used for storage of the store word, and programing the memory elements to the desired resistances.

7. The method of claim 1, wherein the electrically coupled access transistors and memory elements are electrically coupled to the lines of bits and match-lines such that a plurality of the electrically coupled access transistors and memory elements are electrically coupled to a single line of bits and a single match-line.

8. A content addressable memory array comprising:
a plurality of memory cells combined to store stored words, each memory cell including a memory element electrically coupled to an access transistor in series circuit, the memory element configured to store binary data as one of at least two complementary resistances;
a receiving unit configured to receive a search word for search through the content addressable memory array, wherein bit locations of the search word correspond to bit locations of one of the stored words in bit-by-bit sequential order;
a search unit configured to search for the search word while a plurality of memory elements and access transistors are electrically coupled in parallel to a single match line and a single bit-line;
a biasing unit configured to bias the access transistor of each memory cell such that the effective resistance of the access transistor is the complementary resistance of a corresponding bit of the search word; and
a matching unit configured to measure a total resistance of the memory cells for the stored words and to indicate a search match for each stored word if the total resistance is within a predetermined value range.

9. The content addressable memory array of claim 8, wherein the memory elements include a phase change element, a resistive memory element, a floating gate FET, a Magnetoresistive Random Access Memory (MRAM), and a charge trapping device.

10. The content addressable memory array of claim 9, wherein the matching unit is further configured to indicate a memory location of at least one stored word if the total resistance is within the predetermined value range.

11. The content addressable memory array of claim 8, wherein the access transistors are metal-oxide semiconductor field-effect transistors (MOSFET).

12. The content addressable memory array of claim 8, wherein the access transistors are electrically coupled to search-lines such that a plurality of the access transistors are electrically coupled to a single search-line.

13. The content addressable memory array of claim 12, wherein the receiving unit is further configured to receive a store word for storage in the content addressable memory array, each bit in the store word stored to an individual memory cell.

14. The content addressable memory array of claim 13, wherein the biasing unit is further configured to apply voltage pulses in the search-lines such that current pulses through the access transistors of the desired memory cells used for storage of the store word, and program the memory elements to the desired resistances.

15. The content addressable memory array of claim 8, wherein the electrically coupled access transistors and memory elements are electrically coupled to lines of bits match-lines such that a plurality of electrically coupled access transistors and memory elements are electrically coupled to a single line of bits and a single match-line.

16. A memory device comprising:
a memory element settable to a stored resistance, the stored resistance being one of at least two complementary resistances associated with one of at least two complementary binary values;
an access transistor including a common terminal controlling a current flow between a first terminal and a second terminal, the first terminal being electrically coupled to the memory element, and wherein a crystalline state is reached at the common terminal by slowly decreasing a current signal at the common terminal;
a biasing circuit electrically coupled to the common terminal and configured to bias the access transistor to an effective resistance that is complementary to the resistance associated with a search bit; and
a match circuit that indicates a match of a search word where a net resistance of a match-line equals a set resistance multiplied by a resistance ratio between a set and reset state plus one, and divided by the number of bits in the search word.

17. The memory device of claim 16, further comprising a match circuit electrically coupled to the second terminal, the match circuit configured to indicate a search match only if the effective resistance of the access transistor and the stored resistance of the memory element are complementary to each other.

18. The memory device of claim 17, wherein the match circuit is further configured to measure if a search current flowing through the memory element and access transistor is within a predetermined value range.

19. The memory device of claim 17, wherein the match circuit is further configured to indicate a location of the memory element only if the effective resistance of the access transistor and the stored resistance of the memory element are complementary to each other.

20. The memory device of claim 16, wherein the memory element includes a phase change element, a resistive memory element, a floating gate FET, a Magnetoresistive Random Access Memory (MRAM), and a charge trapping device.

21. The memory device of claim 16, wherein the access transistors include a metal-oxide semiconductor field-effect transistors (MOSFET).

22. The memory device of claim 16, wherein the access transistors include a bipolar junction transistor (BJT).

* * * * *